ate Patent [19]

[11] 4,113,492
[45] Sep. 12, 1978

[54] SPIN COATING PROCESS

[75] Inventors: Masamichi Sato; Itsuo Fujii, both of Asaka, Japan

[73] Assignee: Fuji Photo Film Co., Ltd., Minami-ashigara, Japan

[21] Appl. No.: 785,886

[22] Filed: Apr. 8, 1977

[30] Foreign Application Priority Data

Apr. 8, 1976 [JP] Japan .................................. 51-39690

[51] Int. Cl.² .............................................. B05D 3/12
[52] U.S. Cl. ...................................... 96/67; 96/35.1; 96/86 P; 427/240; 427/273; 427/331; 427/335; 427/336; 427/337
[58] Field of Search ........ 427/240, 331, 273, 335–337; 96/67, 35.1

[56] References Cited

U.S. PATENT DOCUMENTS

| 10,789 | 4/1854 | Field | 427/240 |
| 1,744,463 | 1/1930 | Gravel | 427/273 |
| 2,110,282 | 3/1938 | Amsel | 427/240 |
| 2,563,417 | 4/1947 | Pessel | 427/273 |
| 2,987,415 | 6/1961 | Taggett | 427/273 |
| 3,936,301 | 2/1976 | Schneider | 96/35.1 |

Primary Examiner—Ronald H. Smith
Assistant Examiner—Janyce A. Bell
Attorney, Agent, or Firm—Sughrue, Rothwell, Mion, Zinn and MacPeak

[57] ABSTRACT

A process of spin coating a coating composition on the surface of a base plate, comprising supplying a material which is compatable with the coating composition, in either a liquid or vapor form, to the opposite surface of the base plate to the surface on which the coating composition has been supplied (hereinafter "back surface" or "back side") while rotating the base plate to remove the coating composition flowing to the back surface or to the edge portion of the plate. The material compatible with the coating composition may be applied to the surface of the base plate at the periphery thereof to reduce or remove the coating composition there.

14 Claims, 8 Drawing Figures

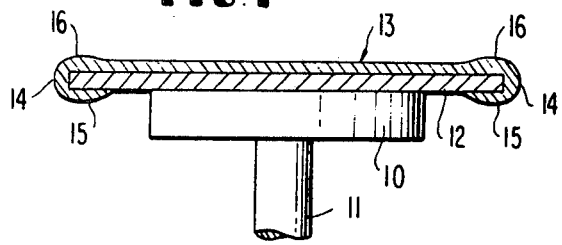
FIG. 1
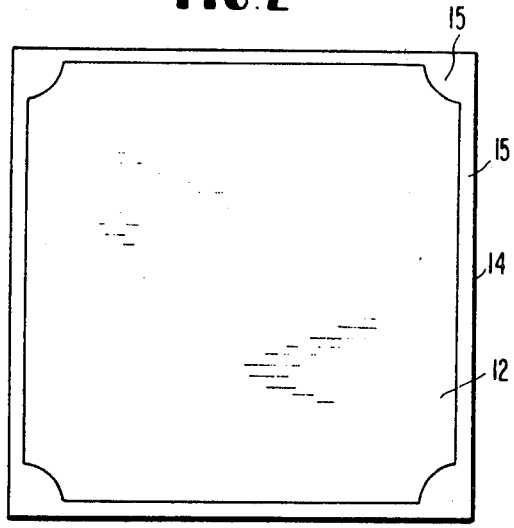
FIG. 2
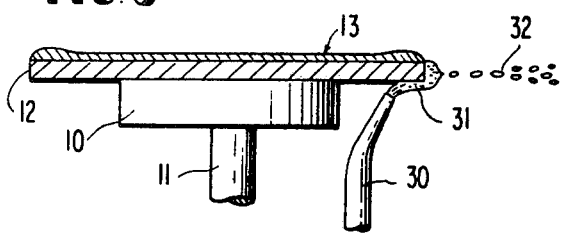
FIG. 3
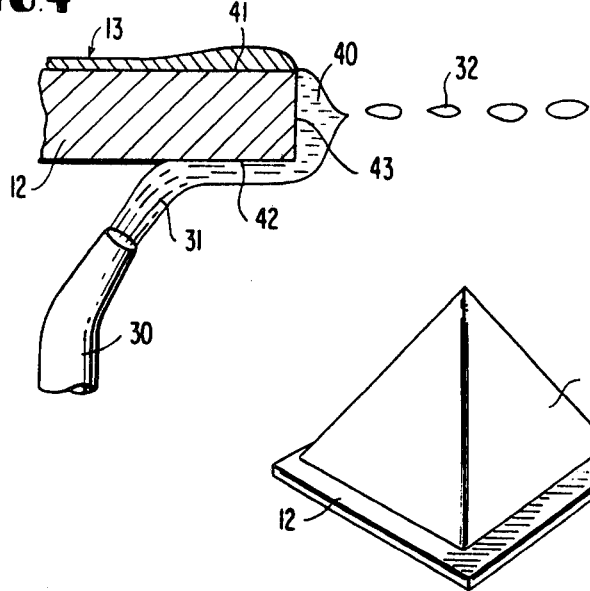
FIG. 4
FIG. 5
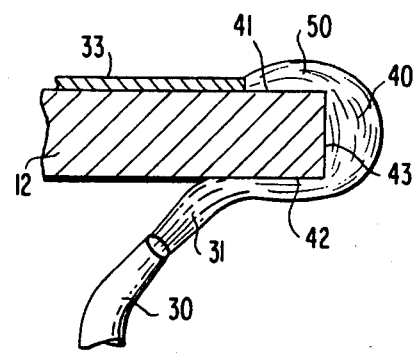
FIG. 6a
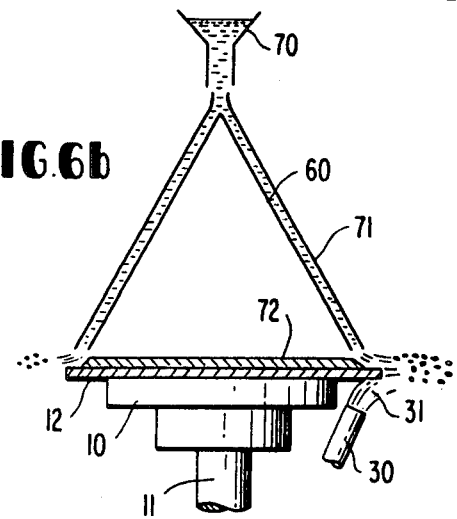
FIG. 6b
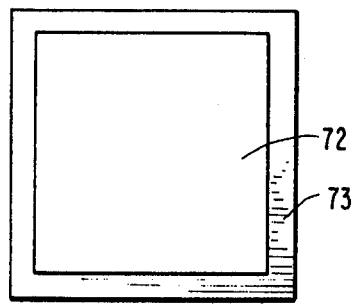
FIG. 6c

SPIN COATING PROCESS

BACKGROUND OF THE INVENTION

1. Field of the Invention

The present invention relates to a spin coating process and, more particularly, to a spin coating process for preventing a coating composition applied to the surface of a base plate from adhering to the back side thereof and to the edge or periphery of the plate.

2. Description of the Prior Art

A technique of forming a photoresist on a base plate by spin coating using an organic solvent as the solvent for the coating composition has widely been employed in the field of producing semiconductor devices, etc. For example, a photoresist coating layer of a uniform thickness is formed by placing a base plate, such as a glass sheet having thereon a thin metallic layer, a silicon wafer, etc., on a turntable of a spinner, applying dropwise a coating composition for a photoresist onto the turntable, and then rotating the turntable at high speed (usually at about 2,000 to about 6,000 r.p.m.).

However, attempts to coat a gelatino silver halide emulsion on a base plate such as a glass sheet and a glass sheet having thereon a thin metal layer by spin coating involve the following difficulties. That is, since the solids content of a gelatino silver halide emulsion is much lower than that of a photoresist coating composition, the dry thickness of the silver halide emulsion layer formed is much thinner than the thickness of the silver halide emulsion layer immediately after coating, namely, the dry thickness of the silver halide emulsion layer is usually about 1/50th the thickness of the silver halide emulsion layer immediately after coating. Therefore, if a gelatino silver halide emulsion is coated by spin coating at high speed as in the case of coating a photoresist coating composition, the dry thickness of the silver halide emulsion layer formed is extremely thin (for example, about ½ to about 1/10 micron). Also, when a gelatino silver halide emulsion is coated by spin coating, the emulsion layer formed contains a large quantity of bubble traces, similar in appearance to a comet, since fine bubbles enter the silver halide emulsion when it spreads over the base plate by the action of centrifugal force.

Furthermore, when the temperature of a gelatino silver halide emulsion layer falls to about room temperature (e.g., about 20°–30° C), the emulsion layer is set, but when the speed of rotation in spin coating is high, the emulsion is frequently set while the emulsion is being spread over a base plate by the rotation of the turntable. On the other hand, the periphery or edge of the set coating is subjected to a large centrifugal force and thus, the emulsion layer at the periphery is sometimes spun off. In this case, it would be desirable for the coating composition to be uniformly spun off at the periphery to expose the surface of the base plate at the periphery in a uniform width but the width or the amount of the emulsion layer thus spun off varies greatly at each position or area. However, when the solids content of a gelatino silver halide emulsion is increased to overcome these difficulties, the silver halide emulsion has an even greater tendency to set, which is undesirable.

Therefore, when a silver halide emulsion is coated on a base plate by spin coating, the coating must be performed at much lower speed of rotation about 100 to about 1,000 r.p.m.) than that used in the above-described photoresist coating. Furthermore, when the viscosity of a coating composition is low or the solids content of a coating composition is low in the case of coating a photoresist coating composition on a base plate or when a coating layer having a thickness of about 5 to about 20 microns is required as in the case of coating a photoresist coating composition of, for example, a copper laminate for a printed circuit, the spin coating must be carried out at a low speed of rotation.

However, when spin coating is performed by rotating the base plate at such a low speed of rotation (in particular, at a low speed of rotation of about 100 to about 500 r.p.m.), the coating composition accumulates at the periphery and further on the back surface of the plate. This phenomenon occurs more markedly at the periphery or the back surface at the corner portions when the base plate has a square or rectangular corner. If the coating composition adheres to the periphery or the back surface of the base plate as mentioned above, the coating composition thus adhered is scraped off after drying as fine pieces, which attach to the coated layer on the surface of the base plate to cause defects such as pinholes. Prevention of this problem is very important if fine images such as those required in production of semiconductor devices, are to be obtained.

SUMMARY OF THE INVENTION

The object of this invention is, therefore, to provide a spin coating process for preventing a coating composition from adhering to the periphery and the back surface of a base plate to be coated.

That is, this invention provides a spin coating process for coating a coating composition on the surface of a base plate, which comprises supplying a material compatable with the coating composition, in a liquid or a vapor form, onto the opposite surface of the base plate to the surface on which the coating composition has been supplied while rotating the base plate to remove the coating composition flowing to the periphery or the opposite surface and/or the edge of the base plate.

BRIEF DESCRIPTION OF THE DRAWINGS

FIG. 1 is a side sectional view showing an embodiment of spin coating in general, FIG. 2 is a front view showing the back side to the coated side of the base plate coated by spin coating shown in FIG. 1, FIG. 3 is a side view showing an embodiment of the spin coating process of this invention, FIG. 4 is the enlarged view of a part of the figure shown in FIG. 3, FIG. 5 is an enlarged view showing a part of another embodiment of the spin coating process of this invention, FIGS. 6a and b are an oblique view and a side sectional view of still other embodiment of the spin coating process of this invention, and FIG. 6c is a plane view showing a square base plate coated by the spin coating process of this invention.

DESCRIPTION OF THE PREFERRED EMBODIMENTS

The invention will now be explained in more detail by reference to the accompanying drawings.

FIG. 1 is a cross sectional view showing an embodiment of spin coating in general. In the figure, a base plate 12 on the surface of which an emulsion is to be coated is placed on a turntable 10 rotatable by a rotary shaft 11. The base plate 12 is generally held on the surface of the turntable 10 by a vacuum applied to the base plate through perforations formed in the turntable but other appropriate means can be employed. Then, a coating composition is supplied onto the surface of the base plate 12 thus held on the turntable 10 and thereafter the turntable 10 is rotated to form on the surface of the base plate 12 a coated layer having a desired thickness. Numeral 13 shows the coated layer formed on the surface of the base plate 12, numeral 14 shows the portion of the coating composition which has reached the edge of the base plate, and numeral 15 shows the portion of the coating composition which has reached the back surface of the base plate 12 at the peripheral portion.

FIG. 2 is a front view showing the back side of the base plate 12 to that coated by spin coating as shown in FIG. 1. When the base plate 12 is square and has corners, the proportion of the coating composition reaching the corner portion of the opposite side is very large as shown by the numeral 15. This is assumed to occur because when spin coating is performed by rotating the base plate 12 at a low speed (about 100 to about 500 r.p.m.), the coating composition which was not spun off by the centrifugal force accumulates on, in particular, the corner portions of the base plate and the coating composition reaches the back side of the base plate around the edge thereof.

FIG. 3 shows an embodiment of the spin coating process of the invention for removing the above described defects. That is, as shown in the figure, a nozzle 30 is disposed for supplying a material 31 (e.g., as a liquid) compatible with the coating composition coated on the base plate onto the back side of the rotating base plate 12. The head of the nozzle 30 is so bent that it is directed toward the peripheral area of the base plate 12 and the above described liquid is ejected through the nozzle toward the back side of the base plate. However, since the liquid 31 ejected from the nozzle 30 and brought into contact with the back side of the rotating base plate 12 is spun off outwardly by the centrifugal force, the head of the nozzle 30 need not always be bent and directed outwardly. The liquid 31 reaching the back side of the base plate 12 is spun away as liquid droplets 32 together with the coating composition adhering to the back side of the base plate 12 and the coating composition attached to the edge thereof by the centrifugal force.

FIG. 4 is given to explain in more detail the process of this invention illustrated in FIG. 3. In the figure, numerals 41, 42, and 43 show the front side, the back side, and the edge respectively of the base plate 12 and the accumulated portion 40 of the coating composition is formed on the edge 43 of the base plate. The liquid 31 supplied from the nozzle 30 reaches the back side 42 of the base plate, flows ourwardly together with the coating composition attached to the back side portion due to the actions of centrifugal force and the velocity of the liquid as it is ejected from the nozzle, and further reaches the edge 43 due to the action of the surface tension of the liquid to dilute the coating composition attached thereto. Thus, the accumulation 40 of the liquid and the coating composition is formed on the edge portion 43 of the base plate and liquid droplets 32 are formed successively from the accumulation 40 due to the centrifugal force, and are then spun off outwardly. Thus, after a certain period of time has passed, this phenomenon occurs over the entire periphery of the base plate 12 and the solids component of the coating composition in the accumulation 40 is substantially absent. When the supply of the liquid from the nozzle is stopped in this state and the rotation of the base plate is further continued (preferably, at a higher rate of rotation), the coated layer 13 without any coating composition attached to the back side and the edge of the base plate is obtained.

In this case, when the speed of rotation in spin coating is low, the centrifugal force applied to a coating composition on a support at the periphery is low and hence the coating composition accumulates at the peripheral portion and the edge portion of the support, which results in an increase in the thickness of the layer at these portions. That is, in FIG. 1, the thickness of the thick layer portion 16 of the coated layer 13 becomes about 2 to 10 times the thickness of the center portion of the coated layer 13 and the width of the thick portion becomes sometimes about 2 to 6 mm. This tendency appears at the peripheral portion of the base plate 12 and is particularly marked at the corner portions. The tendency occurs in the case of coating a photoresist by spin coating but the tendency is particularly remarkable in the case of coating a gelatino silver halide emulsion as compared with the case of coating a photoresist since the wetability of the base plate (such as a glass sheet and a glass sheet having a metal thin film on the surface thereof) by the gelatino silver halide emulsion is poor as compared with an organic solvent used for coating the photoresist. For removing the disadvantage, the thought might be to improve the wetability by the gelatino silver halide emulsion by adding a surface active agent thereto but even though such is an improvement, it is yet insufficient. Furthermore, the addition of a large amount of a surface active agent to a gelatino silver halide emulsion results in a deterioration of adhesivity and the photographic properties of the emulsion and hence it is undesirable to employ a large amount of surface active agent. The reason that the coated layer at the periphery of a base plate becomes thick is believed to be due to the fact that the emulsion possesses a poor wetability for the base plate and the temperature of the emulsion decreases during rotation with the viscosity of the emulsion greatly increasing.

When the thickness of the thick layer is low, there is no practical problem but if the thickness of the thick layer at the periphery of a base plate is extremely high, an uneven gap forms between a photomask and the coated layer in the case of exposing the coated layer in a close contact relationship, which results undesirable effects occuring. Also, when such a coated layer is used for projection printing, an accurate focus is not obtained.

The thick portion of the coated layer at the periphery can be removed or the thickness of the thick portion can be reduced in the following manner. This approach is explained by reference to the embodiment illustrated in FIG. 5. In the figure, numeral 33 shows a coated layer formed on the surface of a base plate 12 and numeral 50 shows the peripheral portion of the base plate 12. That is, according to the embodiment shown in the figure, the liquid 31 supplied is transferred to the front side of the base plate 12 at the periphery by increasing the supply rate of the liquid from the nozzle 30 and/or reducing the speed of rotation of the base plate to dissolve the coated layer or dilute the coating composition at the peripheral portion 50. By the means described above, the coated layer at the peripheral portion 50 is removed or the thickness thereof is reduced.

Such a condition is obtained only when a certain relationship exists between the supply rate of the liquid 31 from the nozzle 30 and the speed of rotation of the base plate 12 but it is difficult to define numerically this relationship. That is, this condition depends upon the kind of liquid used, the kind of coating composition (difference in viscosity, wetability, etc.), the wetability of the base plate, the form of the edge of the base plate, the thickness of the base plate, etc., and hence the optimum condition must be selected each time. However, this is very simple and can be easily determined by controlling the speed of rotation of the base plate and/or the supply rate of the liquid.

The liquid thus transferred to the front side of the base plate 12 dissolves the thick coated layer formed at the periphery of the base plate 12 or dilutes the coating composition at the periphery portion. Thereafter, by increasing the speed of rotation of the base plate 12 and/or stopping the supply of the liquid from the nozzle 30, the thick coated layer formed at the periphery of the base plate 12 is removed or the thickness of the thick layer portion is sufficiently reduced.

In other method of removing the thick coated layer formed on the periphery of a base plate, a nozzle for supplying a liquid to the front side of the base plate at the periphery is disposed in addition to the nozzle for supplying a liquid to the back side of the base plate and the liquid is supplied from the nozzles to the peripheral portions to remove the coating composition at the peripheral portions.

FIG. 6 shows a preferred embodiment of the abovedescribed method. That is, the embodiment shown is for removing the coating composition accumulated on the back side and the edges of the base plate 12 by supplying a liquid to the back side of the base plate by means of a nozzle 30 as well as for removing the coated layer on the right side of the base plate at the periphery with a constant width, that is, for forming a regular square coated layer.

FIG. 6a shows an embodiment wherein a hollow pyramid-like cover 60 is disposed on or above a square base plate 12. In this case, the pyramid cover is so disposed that the center thereof substantially coincides with the center of the base plate. Also, the pyramid-like cover can be rotated together with the base plate.

FIG. 6b shows an embodiment of dissolving away the thick portion of the coated layer by flowing a liquid 71 down along the side walls of the pyramid cover from a liquid reservoir 70 disposed above the pyramid cover. In this manner, the periphery portions 73 of the base plate having the exposed surfaces with a uniform width and the square coated layer 72 formed on the plate are obtained as shown in FIG. 6c.

According to the above-described method, when a base plate 12 has, for example, a square shape, a square coated layer corresponding to the shape is obtained but it is not always necessary to form the coated layer corresponding to the shape of the base plate. For example, when the base plate 12 is square, the shape of the coated layer formed may be circular. Such a mode can be practiced by disposing a nozzle as the nozzle for supplying a liquid to the back side of the base plate 12 and supplying a liquid to the front side of the base plate at the periphery.

This invention can be appropriately employed with any film forming coating composition and as set forth herein, two examples thereof are a photoresist coating composition and a silver halide coating composition.

When this invention is employed in coating a photoresist coating composition, a suitable coating composition viscosity can range from about 10 to about 200 cps and when this invention is employed in coating a silver halide emulsion coating composition, a suitable viscosity can range from about 1 to about 100 cps. Appropriate temperatures which can be used in applying the coating composition are those at which the above viscosities are achieved and such in general will range from above 15° to about 40° C for a photoresist coating composition and from about 20° to about 50° C for the silver halide emulsion coating composition. Appropriate rates of rotation can also be used in coating these compositions and suitable rates of rotation during coating for a photoresist composition can range from about 100 to about 3000 rpm for a photoresist coating composition and from about 50 to about 2000 rpm for a silver halide emulsion coating composition.

In the case of coating a photoresist on a base plate, the materials generally used as the solvents for photoresists can be used as the liquid used in this invention. Examples of suitable liquids are, for example, ketones such as acetone, methyl ethyl ketone, methyl isobutyl ketone, cyclohexanone, diisobutyl ketone, etc.; esters such as ethyl acetate, butyl acetate, n-amyl acetate, methyl formate, ethyl propionate, dimethyl phthalate, ethyl benzoate, etc.; aromatic hydrocarbons such as toluene, xylene, benzene, ethylbenzene, etc.; halogenated hydrocarbons such as tetrachloromethane, trichloroethylene, chloroform, 1,1,1-trichloroethane, monochlorobenzene, chloronaphthalene, etc.; ethers such as tetrahydrofuran, diethyl ether, ethylene glycol monomethyl ether, ethylene glycol monoethyl ether acetate, etc.; dimethylformamide; dimethylsulfoxide; and the like. Furthermore, solvents other than those described above, which can dissolve the coating composition used or are compatible with the coating composition can be used in this invention as well.

Moreover, a typical example of the liquid employed in the case of coating a silver halide emulsion on a base plate is warm water at about 30° to about 60° C. Furthermore, a lower alcohol such as methanol, ethanol, propanol, etc.; or acetone may be also used for this purpose. Also, a surface active agent may be incorporated in these liquids for improving the wetability of the liquids for the base plate.

In this invention, liquids described herein can be also used in a vapor form. On comparing the effects between the liquid form and the vapor form, the use of a liquid is more preferred since in this case the liquid more easily and more completely removes the coating composition accumulated on the back side and the edge of a base plate and also more effectively reduces the thickness of the thick coated layer formed on the base plate at the periphery.

The liquid or the vapor may be supplied to a base plate at any time during rotation of the base plate after supplying thereto a coating composition. That is, the liquid or the vapor may be supplied to the rotating base plate before or after drying the coating compositions formed on the front side thereof and on the back side and the edge of the base plate. However, it is preferred to supply the liquid or the vapor to the rotating base plate before drying the coating layer formed thereon since the coating composition accumulated on the back side and the edge of the base plate can be easily removed and also the coated layer formed on the periphery of the base plate can be effectively improved. In particular, when the coating composition is a gelatino silver halide emulsion, it is desirable to supply the liquid to the base plate when the silver halide emulsion supplied thereto is set.

While the invention has been described in detail and with reference to specific embodiments thereof, it will be apparent to one skilled in the art that various changes and modifications can be made therein without departing from the spirit and scope thereof.

What is claimed is:

1. A process of spin coating a coating composition on a surface of a base plate which comprises projecting material, which is compatible or dissolves the coating composition, in a liquid or vapor form to the opposite surface of the base plate to the surface on which the coating composition has been supplied while rotating the base plate to remove the coating composition flowing to the opposite surface and/or the edge of the base plate.

2. The process as claimed in claim 1, wherein the process additionally includes supplying the material compatible with the coating composition to the front side of the base plate at the periphery thereof to reduce or remove the coated layer at the peripheral portions.

3. The process as claimed in claim 1 wherein the material is ejected from a nozzle.

4. The process as claimed in claim 1 wherein the coating composition is a photoresist.

5. The process as claimed in claim 1 wherein the coating composition is a silver-halide emulsion.

6. The process as claimed in claim 4 wherein the rate of rotation is about 100 to about 3,000 rpm.

7. The process as claimed in claim 5 wherein the rate of rotation is about 50 to about 2,000 rpm.

8. The process as claimed in claim 1 wherein the base plate is a glass sheet or a glass sheet having a thin metal film on the surface thereof.

9. The process as claimed in claim 4, wherein a solvent for the photoresist is the material used.

10. The process as claimed in claim 4 wherein the material used is a liquid selected from the group consisting of ketones, esters, aromatic hydrocarbons, halogenated hydrocarbons, ethers, dimethylformamide and dimethylsulfoxide.

11. The process as claimed in claim 9 wherein said ketone is acetone, methyl ethyl ketone, methyl isobutyl ketone, cyclohexanone, or disobutylketone; said ester is ethyl acetate, butyl acetate, n-amyl acetate, methyl formate, ethyl propionate, dimethyl phthalate or ethyl benzoate; said aromatic hydrocarbon is toluene, xylene, benzene or ethylbenzene; said halogenated hydrocarbon is tetrachloromethane, trichloroethylene, chloroform, 1,1,1-trichloroethane, monochlorobenzene or chloronapththalene; and said ether is tetrahydrofuran, diethyl ether, ethylene glycol monomethyl ether, or ethylene glycol monoethyl ether acetate.

12. The process as claimed in claim 5 wherein said material used is warm water of about 30°–60° C, a lower alcohol or acetone.

13. The process as claimed in claim 12 wherein the lower alcohol is methanol, ethanol or propanol.

14. The process as claimed in claim 2 wherein a surface active agent is incorporated into the material used.

* * * * *